(12) United States Patent
Hoermaier et al.

(10) Patent No.: US 11,280,844 B2
(45) Date of Patent: Mar. 22, 2022

(54) DEVICE AND METHOD FOR MONITORING A RELIABILITY OF A CELL IMPEDANCE MEASUREMENT OF A BATTERY CELL

(71) Applicant: Infineon Technologies AG, Neubiberg (DE)

(72) Inventors: Klaus Hoermaier, Krumpendorf (AT); Guenter Hofer, St. Oswald (AT); Stefano Marsili, Faak am See (AT)

(73) Assignee: Infineon Technologies AG, Neubiberg (DE)

( * ) Notice: Subject to any disclaimer, the term of this patent is extended or adjusted under 35 U.S.C. 154(b) by 153 days.

(21) Appl. No.: 16/780,345

(22) Filed: Feb. 3, 2020

(65) Prior Publication Data

US 2020/0256924 A1 Aug. 13, 2020

(30) Foreign Application Priority Data

Feb. 8, 2019 (DE) .......................... 102019103144.3

(51) Int. Cl.
*G01R 31/396* (2019.01)
*G01R 31/3835* (2019.01)
*G01R 31/389* (2019.01)

(52) U.S. Cl.
CPC ......... *G01R 31/396* (2019.01); *G01R 31/389* (2019.01); *G01R 31/3835* (2019.01)

(58) Field of Classification Search
CPC . G01R 31/396; G01R 31/389; G01R 31/3835
See application file for complete search history.

(56) References Cited

U.S. PATENT DOCUMENTS

| 8,035,396 B2* | 10/2011 | Kim ..................... G01R 31/389 324/430 |
| 8,684,596 B2* | 4/2014 | Nishi ................. G01R 31/3842 374/152 |
| 9,035,619 B2* | 5/2015 | van Lammeren ........ G01K 7/26 320/134 |
| 2012/0185189 A1 | 7/2012 | Li et al. |
| 2014/0167684 A1 | 6/2014 | Miyanaga |
| 2018/0217209 A1* | 8/2018 | Marsili ............... G01R 31/389 |
| 2019/0036356 A1 | 1/2019 | Subbaraman et al. |
| 2019/0036373 A1* | 1/2019 | Shimura ............. G01R 31/389 |

FOREIGN PATENT DOCUMENTS

DE 102014007304 A1 1/2015

\* cited by examiner

*Primary Examiner* — Walter L Lindsay, Jr.
*Assistant Examiner* — Milton Gonzalez
(74) *Attorney, Agent, or Firm* — Murphy, Bilak & Homiller, PLLC

(57) ABSTRACT

Various examples relate to techniques of monitoring a reliability of a cell-impedance measurement of a battery cell. In one example, a device includes a first interface configured to inject an AC excitation current into a battery cell and a shunt resistor coupled in parallel to the battery cell. The device also includes a second interface configured to inject an AC test current into the shunt resistor. The device also includes analog-to-digital converters configured to measure a cell voltage across the battery cell associated with the AC excitation current, a shunt voltage across the shunt resistor associated with the AC excitation current and the shunt voltage across the shunt resistor associated with the AC test current.

13 Claims, 14 Drawing Sheets

DEVICE AND METHOD FOR MONITORING A RELIABILITY OF A CELL IMPEDANCE MEASUREMENT OF A BATTERY CELL

TECHNICAL FIELD

Various examples of the invention generally relate to monitoring an electrical characteristic of a battery cell of a battery. Various examples of the invention specifically relate to determining a reliability of a cell impedance measurement of the battery cell of the battery.

BACKGROUND

Rechargeable batteries—e.g., lithium-ion batteries—are used in various applications. For example, electric vehicle batteries or traction batteries are used to power the propulsion of electric vehicles. Mobile devices, such as cell phones, also employ rechargeable batteries.

In various use cases, the state of the rechargeable batteries is monitored. For example, a cell voltage across a battery cell can be monitored. Also, a temperature or a pressure of the battery cell can be monitored. This can be done to, e.g., detect malfunction or track ageing. A state of charge (SOC) and/or a state of health (SOH) may be determined. For instance, a Coulomb counter may be employed to determine the SOC. The SOH can be dependent on a charging cycle of the battery. It would also be possible to measure one or more electrical characteristics of the battery cells.

It has been observed that in certain scenarios the state monitoring itself can malfunction. Then, erroneous measurements of the state of the rechargeable battery, such as the temperature, can result. This can be safety critical, e.g., in connection with use cases such as traction batteries, etc.

SUMMARY

Therefore, a need exists for determining a reliability of state measurements of a battery cell.

According to an embodiment, a device includes a first interface. The first interface is configured to inject an AC excitation current into a battery cell and a shunt resistor. The shunt resistor is coupled in parallel to the battery cell. The device also includes a second interface. The second interface is configured to inject an AC test current into the shunt resistor. The device further includes one or more analog-to-digital converters configured to measure a cell voltage across the battery cell associated with the AC excitation current, a shunt voltage across the shunt resistor associated with the AC excitation current and the shunt voltage across the shunt resistor associated with the AC test current.

A system includes the device. The system may also include the shunt resistor. The system may also include the battery cell. The system may also include a control logic.

A method includes, in a first operational mode, injecting an AC excitation current into a battery cell and a shunt resistor coupled in parallel to the battery cell. The method also includes, in the first operational mode, determining a cell impedance of the battery cell based on a cell voltage across the battery cell associated with the AC excitation current and based on a shunt voltage across the shunt resistor associated with the AC excitation current. The method also includes, in a second operational mode, injecting an AC test current into the shunt resistor. The method also includes, in the second operational mode, determining a reliability of the cell impedance based on the shunt voltage across the shunt resistor associated with the AC test current.

A method includes providing a first AC excitation current to a battery cell device. The method also includes measuring a first value of a cell impedance of a battery cell of the battery cell device based on the first AC excitation current. The method also includes providing a second AC excitation current to the battery cell. The first AC excitation current and the second AC excitation current have different frequencies. The method also includes measuring a second value of the cell impedance of the battery cell based on the second AC excitation current. The method further includes, based on a predefined temperature-impedance characteristic, determining a first temperature based on the first value of the cell impedance and determining a second temperature based on the second value of the cell impedance. The method also includes determining a reliability of the cell impedance based on a comparison of the first temperature and the second temperature.

A control logic is configured to control a test module to provide an AC excitation current to a battery cell device. The control logic is also configured to control one or more analog-to-digital converters to measure a first value of a cell impedance of a battery cell of the battery cell device based on the first AC excitation current. The control logic is also configured to control the test module to provide a second AC excitation current to battery cell. The first AC excitation current and the second AC excitation current have different frequencies. The control logic is also configured to control the one or more analog-to-digital converters to measure a second value of the cell impedance of the battery cell based on the second AC excitation current. The control logic is further configured to determine, based on a predefined temperature-impedance characteristic, a first temperature based on the first value of the cell impedance. The control logic is also configured to determine, based on the predefined temperature-impedance characteristic, a second temperature based on the second value of the cell impedance. The control logic is further configured to determine a reliability of the cell impedance based on a comparison of the first temperature and the second temperature.

A method includes injecting an AC excitation current into a battery cell using a force terminal. The method also includes measuring a cell voltage across the battery cell using a sense terminal. The method also includes determining a cell impedance of the battery cell based on the cell voltage and the AC excitation current. The method also includes measuring a resistance between the force terminal and the sense terminal. The method also includes performing a threshold comparison between a predefined threshold resistance and the measured resistance between the force terminal and the sense terminal. The method also includes determining a reliability of the cell impedance based on the threshold comparison.

A control logic is configured to control a test module to inject an AC excitation current into a battery cell using a force terminal. The control logic is configured to control one or more analog-to-digital converters to measure a cell voltage across the battery cell using a sense terminal. The control logic is further configured to determine a cell impedance of the battery cell based on the cell voltage and the AC excitation current. The control logic is further configured to control the one or more analog-to-digital converters to measure a resistance between the force terminal and the sense terminal. The control logic is also configured to perform a threshold comparison between a predefined threshold resistance and the measured resistance between the force terminal and the sense terminal; and to determine a reliability of the cell impedance based on the threshold comparison.

A method includes providing an AC excitation current to a battery cell device. The method also includes measuring a cell voltage across a battery cell of the battery cell device. The method also includes determining a cell impedance of the battery cell based on the cell voltage and the AC excitation current. The method also includes providing a test current pulse to the battery cell device. The method also includes measuring a voltage response of the battery cell device to the test current pulse. The method also includes determining a reliability of the cell impedance based on the voltage response.

A control logic is configured to control a test module to provide an AC excitation current to a battery cell device. The control logic is further configured to control one or more analog-to-digital converters to measure a cell voltage across a battery cell of the battery cell device. The control logic is further configured to determine a cell impedance of the battery cell based on the cell voltage and the AC excitation current. The control logic is further configured to control the test module to provide a test current pulse to the battery cell device. The control logic is further configured to control the one or more analog-to-digital converters to measure a voltage response of the battery cell device to the test current pulse. The control logic is also configured to determine a reliability of the cell impedance based on the voltage response.

A method includes providing an AC excitation current to a battery cell device. The method also includes measuring a cell voltage across a battery cell of the battery cell device. The method also includes determining a cell impedance of the battery cell based on the cell voltage and the AC excitation current. The method also includes performing a threshold comparison between an amplitude of the AC excitation current and a reference amplitude. The method also includes determining a reliability of the cell impedance based on the comparison.

A control logic is configured to control a test module to provide an AC excitation current to a battery cell device. The control logic is further configured to control one or more analog-to-digital converters to measure a cell voltage across a battery cell of the battery cell device. The control logic is further configured to determine a cell impedance of the battery cell based on the cell voltage and the AC excitation current. The control unit is further configured to perform a threshold comparison between an amplitude of the AC excitation current and a reference amplitude; and to determine a reliability of the cell impedance based on the comparison.

A method includes providing an AC excitation current to a battery cell device. The AC excitation current is generated using a first timing reference. The method also includes measuring a cell voltage across a battery cell of the battery cell device. The method also includes determining a cell impedance of the battery cell based on the cell voltage and the AC excitation current. The method also includes performing a comparison between a timing of the AC excitation current and a further timing associated with a second timing reference different from the first timing reference. The method also includes determining a reliability of the cell impedance based on the comparison.

A control logic is configured to control a test module to provide an AC excitation current to a battery cell device. The control logic is further configured to control one or more analog-to-digital converters to measure a cell voltage across a battery cell of the battery cell device. The control logic is further configured to determine a cell impedance of the battery cell based on the cell voltage and the AC excitation current. The control logic is further configured to perform a comparison between a timing of the AC excitation current and a further timing associated with a second timing reference different from the first timing reference; and to determine a reliability of the cell impedance based on the comparison.

It is to be understood that the features mentioned above and those yet to be explained below may be used not only in the respective combinations indicated, but also in other combinations or in isolation without departing from the scope of the invention.

DETAILED DESCRIPTION

Figure 1:
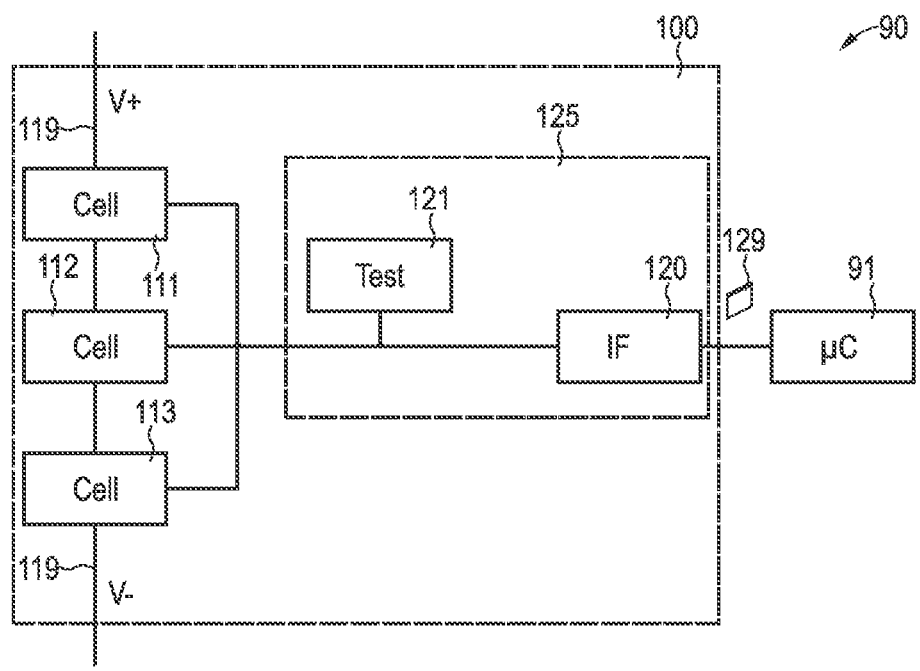
FIG. 1 schematically illustrates a system according to various examples, the system including a battery module including multiple battery cell devices, a test module, a communication module, and a control device.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, various techniques of operating batteries, in particular rechargeable batteries are described. Batteries as described herein may include one or more battery modules. Each battery module, in turn, may include one or more battery cells. The battery cells of a battery module may be connected in parallel and/or in sequence. As a general rule, the techniques described herein may be applicable for various kinds and types of batteries, e.g., lithium-ion batteries, lithium-ion polymer batteries, vanadium-based batteries, etc. The batteries may be employed as traction batteries for battery-electric vehicles. Other use cases of the batteries include on-board batteries for airplanes or trains, electrical storage devices in an electric microgrid, batteries for handheld electronic devices, e.g., smartphones, etc.

More specifically, techniques of battery management are described hereinafter. For example, techniques described herein may be executed by one or more components of a battery management system (BMS).

As a general rule, the techniques described herein may operate on battery cell-level. Specifically, battery management for individual battery cells may be provided. For sake of simplicity, hereinafter, various techniques are described in connection with a single battery cell. Such techniques may be readily applied to a plurality of battery cells.

According to various examples, an electrical characteristic of the battery cell may be monitored. Based on monitoring the electrical characteristic, it becomes possible to determine an electrical state of the battery cell. Specifically, according to examples described herein, it is possible to monitor an electrical impedance of the battery cell (cell impedance). Corresponding techniques for a cell-impedance measurement are described.

The cell impedance is a measure of the opposition that the battery cell presents to an AC voltage when an AC excitation current is applied. The impedance can be generally defined by the ratio of the complex representation of a sinusoidal AC voltage between the two terminals of the battery cell and the complex representation of the AC excitation current flowing through the battery cell.

Based on the cell impedance, it would be possible to, e.g., determine a SOH and/or SOC and/or a temperature at the battery cell. When using the cell impedance to determine the temperature, it becomes possible to obtain an accurate measure of the inner cell temperature (if compared to reference implementations where an external temperature-sensitive element is used that is arranged at a distance to the battery cell). This reduces lag time and can help to reduce error margins. Alternatively or additionally, the SOH of the battery cell can be determined based on the cell impedance: for example, there can be a tendency of an increasing cell impedance over ageing of the battery cell. The SOH, in turn, can then correlate with the electrical cell capacity. It will be appreciated from the above, various applications of a cell-impedance measurement are conceivable.

Various techniques described herein are based on the finding that at least some of such applications of the cell-impedance measurement can be safety-related. For example, in case the temperature is determined based on the impedance of the battery cell, a malfunction of the cell-impedance measurement may result in a significant error in the temperature. Then, safety of the operation of the battery-powered devices—e.g., of the vehicle in case of a traction battery—can be compromised.

Hereinafter, various safety mechanisms are described that help to implement the cell-impedance measurement in a reliable manner. Techniques described herein may facilitate detecting operational errors in one or more components of the BMS involved in the cell-impedance measurement. Thus, generally, various techniques described herein can help to determine the reliability of the cell impedance that is measured. The reliability can correspond to error margins or a level of uncertainty with which the cell impedance can be measured.

Example components of the BMS that can be checked for operational reliability include: (i) a shunt resistor; (ii) an AC excitation current including a transistor to switch the AC excitation current; (iii) components such as filter resistors, filter capacitor, wiring/traces, connectors; (iv) shorts between cell force and cell sense terminals; (v) measurement settings; and (vi) a data communication to a control device.

As a general rule, there are various options available to determine the reliability of the cell impedance. Different options may target the operational reliability of different components. In various examples, it would be possible to only use one or some of these options. In further examples, it is possible to combine such options. For example, a first option for determining the reliability of the cell impedance may help to detect malfunction of a shunt resistor, while a second option may help to detect malfunction of an analog-to-digital (ADC) converter. A third option may be used to detect end-to-end malfunction, i.e., of one or more components of the BMS (a discrimination between which particular component malfunctioned may not be possible in all cases).

FIG. 1 schematically illustrates a system 90 according to various examples.

The system 90 includes a battery module 100. The battery module 100 includes multiple battery cell devices 111-113. Each battery cell device 111-113 includes a respective battery cell (not illustrated in FIG. 1). While in the example of FIG. 1 the battery cell devices 111-113 form a series connection on a battery power line 119, in other examples, alternatively or additionally, at least some of the battery cell devices 111-113 may form a parallel connection along the battery power line 119. Each battery cell device 111-113 may include a cell monitoring module (not illustrated in FIG. 1). The cell monitoring modules of the battery cell devices 111-113 can provide sense functionality to measure one or more states of the battery cells.

The system 90 also includes an interface device 125. The interface device 125 and the battery cell devices 111-113 are coupled via one or more interfaces (FIG. 1 does not illustrate details of the interfaces). As a general rule, such interfaces may include one or more of a pin, a wiring, a wire bond, etc.

The interface device 125 includes a communication module 120. The communication module 120 facilitates communication of data 129 between the battery module 100 and a control logic such as a control device 91 implemented by a microcontroller or an field-programmable gated array or an application-specific integrated circuit, etc.

For example, the data 129 may be indicative of one or more observables characterizing the operational state of the battery cell devices 111-113. For example, the data 129 may be indicative of a respective cell impedance of each one of the cells of the cell devices 111-113. The data 129 may digitally encode one or more respective values.

To facilitate generating the data 129, the interface device 125 can include a test module 121 (while in the scenario FIG. 1, the test module 121 and the communication module 120 are each associated with multiple battery cell devices 111-113, in other examples, the test module 121 and/or the communication module 120 could be associated with a single battery cell device 111-113). As a general rule, it would be possible that the communication module 120 and the test module 121 are implemented as an integrated circuit (IC).

The test module 121, the communication module 120, and the control device 91 may implement a BMS.

The test module 121 can be configured to facilitate a cell-impedance measurement—e.g., upon a respective command issued by the control device 91. For example, the test module 121 could include one or more current sources that are configured to provide an AC excitation current to one or more of the battery cell devices 111-113. Then, the voltage across the battery cell devices 111-113 and a phase shift between the voltage and the AC excitation current could be measured, to thereby determine the cell impedance. The cell impedance may be determined by the control device 91.

According to various examples described herein, the test module 121 is also configured to facilitate determining the reliability of the cell impedance. The reliability can correspond to a level of uncertainty associated with the measurement of the cell impedance. To this end, the test module 121 may be configured to operate in different modes. This is explained in connection with FIG. 2.

Figure 2:
FIG. 2 is a schematic state diagram illustrating a measurement mode and a test mode according to which the battery module of FIG. 1 can operate.

FIG. 2 is a schematic state diagram illustrating different modes 2001, 2002 in which the interface device 125 can operate. For example, the test module 121 and/or the communication module 120 may be configured to operate in the modes 2001, 2002.

In detail, the interface device 125 may be configured to selectively operate in (i) a measurement mode 2001—in which the cell impedance can be measured—, and a (ii) a test mode 2002—in which the reliability of the cell impedance can be determined. For example, depending on whether the interface device 125 operates in the measurement mode 2001 or the test mode 2002, different signals may be generated by one or more current sources of the test module 121 or signals may be routed differently in the communication module 120, etc.

For example, the control device 91 may command a transition between the measurement mode 2001 and the test mode 2002. For example, the control device 91 may issue a respective command to the interface device 125. For example, the measurement mode 2001 and the test mode 2002 may be activated in accordance with a predefined timing schedule. For example, the control device 91 may provide settings for the operation of the test module 121 and/or the communication module 120 according to the measurement mode 2001 and the test mode 2002, respectively.

For example, operation in the measurement mode 2001 or the test mode 2002 may be synchronized between the control device 91 and the interface device 125.

While in FIG. 2 two distinct modes 2001, 2002 are illustrated, as a general rule, it would be possible that at least some tests associated with determining the reliability of the cell impedance are determined in the measurement mode 2001. Hence, it may not be required in all scenarios to have two distinct modes.

Such techniques of employing the measurement mode 2001 and the test mode 2002 are based on the finding that if the same settings for the measurement mode 2001 and the test mode 2002 were used, then these settings may become common cause in a fault chain. If no external safety mechanism performing a plausibility check in the control device 91 is possible, the setting have to be protected. To do so, it would be possible that the control device 91 sends the settings for the measurement mode 2001 and the test mode 2002 before each activation of the respective mode 2001, 2002 to the battery module 100. Such settings for the test mode 2002 can be stored in different registers as the setting for the measurement mode 2001 at the control device 91.

Figure 3:
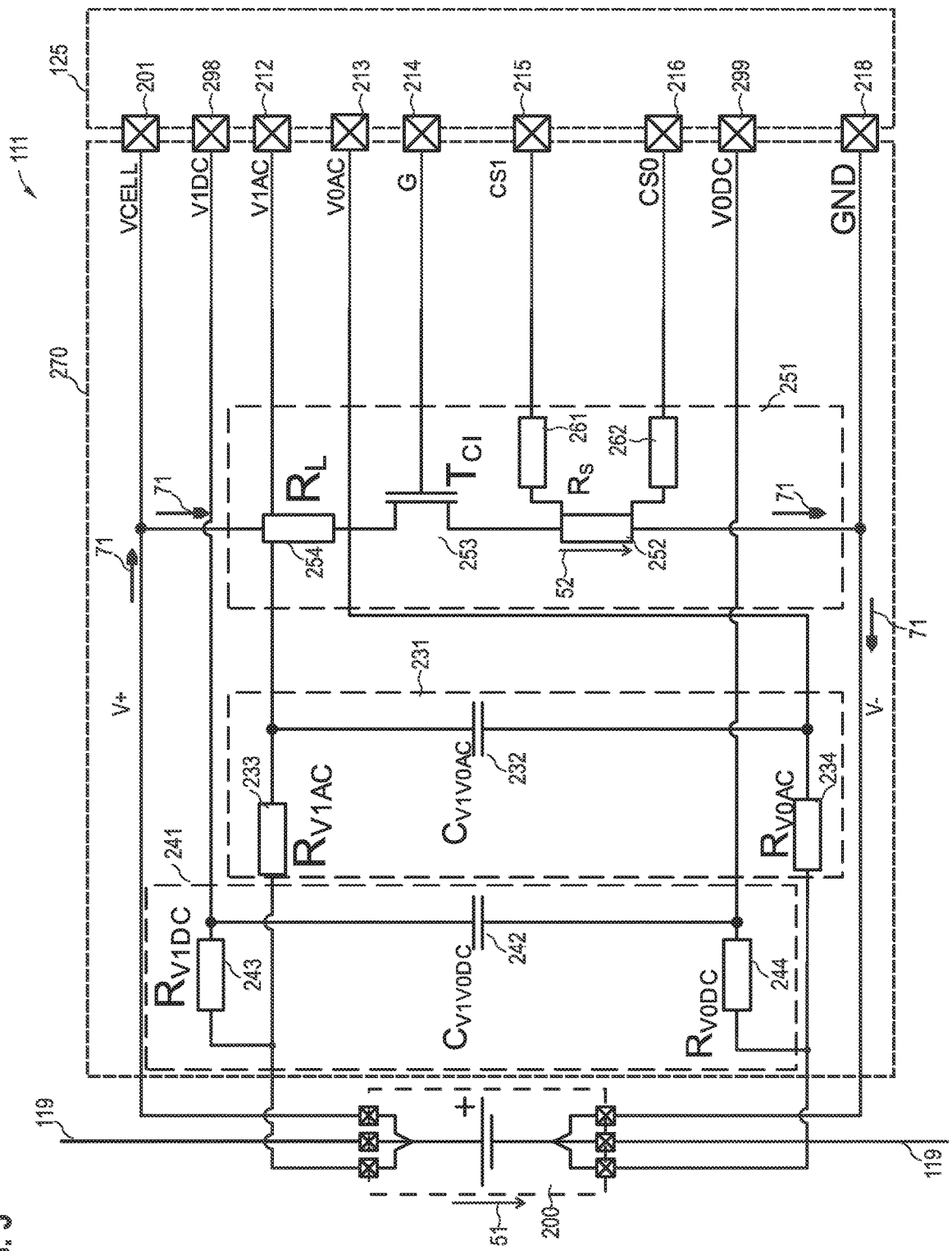
FIG. 3 schematically illustrates details of a battery cell device according to various examples.

FIG. 3 schematically illustrates aspects with respect to the battery cell device 111 and the interfaces 201, 212-216, 218, 298-299 between the battery cell device 111 and the interface device 125.

The interfaces 201, 212-126, 218, 298-299 are partly associated with the battery cell device 111 and partly associated with the interface device 125. For example, the interface device 125 and the battery cell device 111 each may include one or more pins and/or wiring to implement the interfaces 201, 212-216, 218, 298-299.

FIG. 3 illustrates the battery cell device 111 at greater detail. The battery cell devices 112-113 could be configured similarly.

The battery cell device 111 includes the battery cell 200. The battery power line 119 is connected to the battery cell 200. The battery cell device 111 can be interfaced via a high-side cell interface 201 (labeled VCELL) and a ground-side cell interface 218 (labeled GND) to contact the battery cell 200.

The battery cell device 111 also includes a cell monitoring module 270. The cell monitoring module 270 can include components integrated on one or more chips. The cell monitoring module facilitates sensing functionality to determine one or more states of the battery cell 200.

To inject an AC excitation current 71 into the battery cell 200 by the interface device 125 via the cell interfaces 201, 218, a branch 251 is provided as part of the cell monitoring module 270; the branch 251 extends between the cell interface 201 and the cell interface 218. The branch 251 includes a shunt resistor 252. The shunt resistor 252 is coupled in parallel to the battery cell 200, in between the cell interfaces 201, 218. It is also possible to measure the voltage 52 across the shunt resistor 252 using shunt interfaces 215, 216 (labeled CS1 and CS0 in FIG. 3). A transistor switch 253 is provided in the branch 251. A control terminal of the transistor switch 253 (e.g., a gate terminal in case the transistor switch is implemented by a field-effect transistor) is coupled to an interface 214 of the battery cell device 111. By appropriately switching on and off the transistor switch 253, it is possible to set a frequency of the AC excitation current 71.

The branch 251 also optionally includes a load resistor 254. The load resistor 254 is connected to the positive terminal of the battery cell 200; in other examples, the load resistor 254 could also be connected to the negative terminal of the battery cell 200.

Because the AC excitation current 71 can be provided to the battery cell 200 by means of the cell interface 201, the cell interface 201 implements a cell force terminal.

The battery cell device 111 can also be interfaced via AC interfaces 212, 213 (labeled V1AC and V0AC) configured to provide a signal indicative of the AC component of the voltage 51 across the battery cell 200. Hence, the AC interface 212 implements a cell sense terminal.

The AC interfaces 212, 213 are coupled with the battery cell 200 via a filter 231 of the cell monitoring module 270, the filter 231 including a capacitor 232 and a resistor 233 and a resistor 234. The filter 231 can implement low-pass functionality. The cut-off frequency of the filter 231 can be higher than the frequency of the AC excitation current 71.

The battery cell device 111 can also be interfaced via DC interfaces 298, 299 configured to provide a signal indicative of the DC component of the voltage 51 across the battery cell 200. For this purpose, the DC interfaces 298, 299 are connected to the battery cell 200 via a filter 241 of the cell monitoring module 270, the filter 241 including a resistor 243, a capacitor 242, and a resistor 244. The filter 241 can implement a low-pass functionality.

As a general rule, it would be possible that all elements of the cell monitoring module 270 are provided as an integrated circuit (IC). In other examples, it would be possible that at least some parts of the branch 251—e.g., the transistor switch 253 and/or the shunt resistor 252—can be provided on another chip if compared to the filter 231 and/or the filter 241: For example, a separate chip can be used for the shunt resistor 252 and/or the transistor switch 253. In some examples, it would even be possible that the shunt resistor 252 and/or the transistor switch 253 are integrated on the same chip as at least some of the elements of the interface device 125.

Next, the function of the battery cell device in the measurement mode 2001 (cf. FIG. 2) to facilitate the cell-impedance measurement is explained.

In the measurement mode 2001, the AC excitation current 71 is provided to the battery cell device 111 by the test module 121 of the interface device 125 and injected into the battery cell 200 via the cell interfaces 201, 218. For example, the test module 121 could provide a control signal via the interface 214.

The voltage 51 across the battery cell can be monitored via the AC interfaces 212, 213. The AC excitation current 71 can be monitored via the shunt interfaces 215, 216. Aspects with respect to said monitoring are illustrated in connection with FIG. 4.

Figure 4:
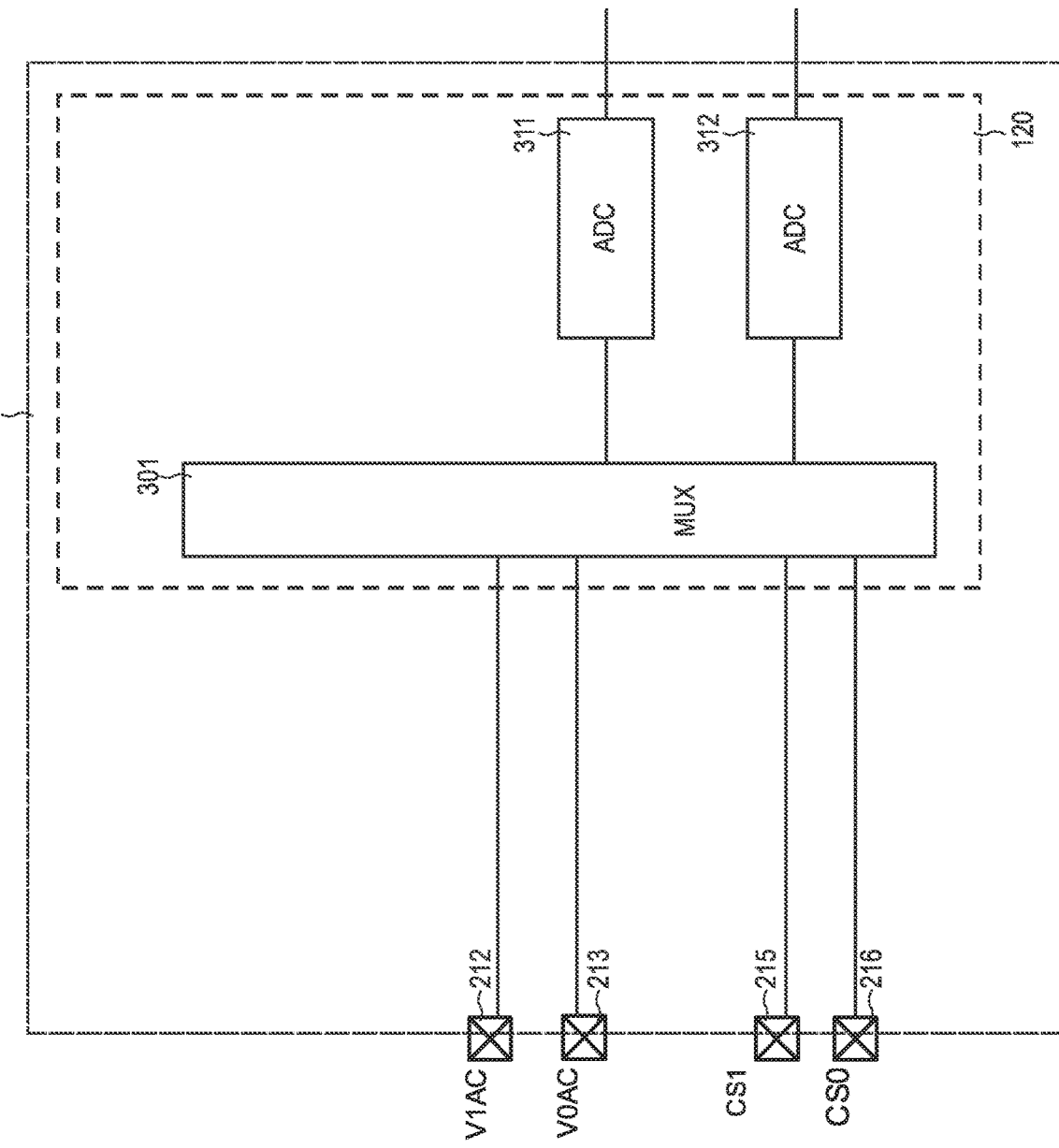
FIG. 4 schematically illustrates details of the communication module according to various examples and, more specifically, schematically illustrates a part of the impedance measurement path showing measurement analog-to-digital converters for measuring voltage and current with an additional multiplexer to configure a routing to the ADCs.

FIG. 4 schematically illustrates aspects with respect to the interface device 125. FIG. 4 schematically illustrates aspects with respect to the communication module 120. FIG. 4 also illustrates aspects with respect to the interfaces 212, 213, 215, 216.

An ADC 311 of the communication module 120 is connected to the AC interfaces 212, 213; and a further ADC 312 of the communication module 120 is connected to the shunt interfaces 215, 216. A respective multiplexer (MUX) 311 is generally optional.

The ADCs 311, 312 can then generate the data 129 indicative of the amplitude and/or phase of the voltage 51 and of the AC excitation current 71. Then, based on the data 129, the cell impedance can be determined. Details with respect to determining the cell impedance are explained in connection with FIG. 5.

Figure 5:
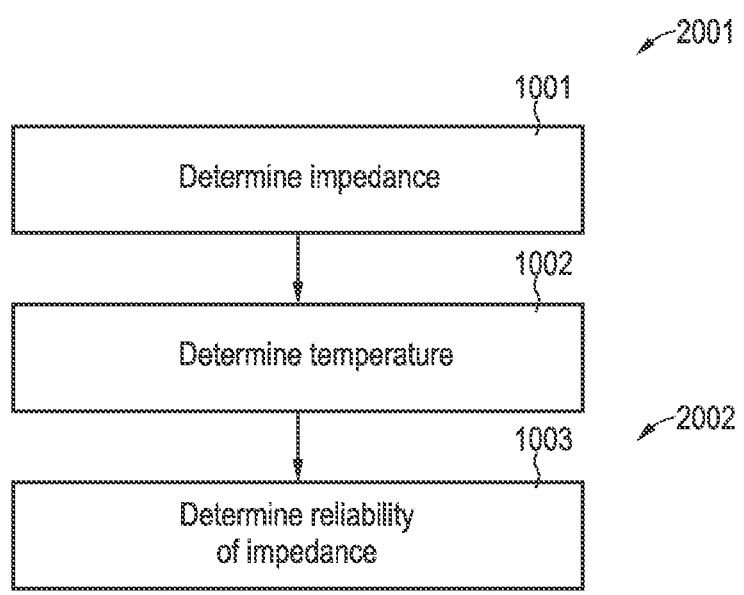
FIG. 5 is a flowchart of a method according to various examples.

FIG. 5 is a flowchart of a method according to various examples. For example, the method of FIG. 5 could be executed by a control device of a BMS, e.g., the control device 91 of the system 90 according to FIG. 1. The method of FIG. 5 is explained in connection with the system 90 of FIG. 1, but could also be applied for other systems.

FIG. 5 illustrates aspects with respect to determining the cell impedance: At block 1001, the impedance of a battery cell 200 of a battery cell device 111-113 is determined. For this, the control device 91 can activate the measurement mode 2001 (cf. FIG. 2). For example, the control device 91 can send a respective command and optionally settings to the interface device 125.

Activation of the measurement mode 2001 may cause an injection of the AC excitation current 71 into the battery cell 200 and the shunt resistor 252, as explained in connection with FIG. 3.

Then, the control device 91 receives data 129 from the communication module 120 that is indicative of (i) the amplitude and/or the phase of the AC excitation current 71 and (ii) the amplitude and/or the phase of the voltage 51 across the battery cell 200 associated with the AC excitation current 71 (as explained in connection with FIG. 3 and FIG. 4). Then, based on the data 129 it is possible to determine the impedance of the battery cell 200 by comparing the (i) amplitude and/or phase of the AC excitation current 71 with the (ii) amplitude and/or phase of the voltage 51 across the battery cell 200 associated with the AC excitation current 71.

At block 1002, a temperature of the battery cell may be determined. For this, a predefined temperature-impedance characteristic can be used. For example, the predefined temperature-impedance characteristic can be provided in the form of a parametrized function, e.g., a polynomial function. Alternatively or additionally, the predefined temperature-impedance characteristic could also be provided in form of a lookup table. Alternatively or additionally to determining the temperature, it would be possible to determine one or more other characteristics of the battery cell, e.g., SOH and/or SOC.

Next, at block 1003, a reliability of the impedance determined at block 1001 is determined. To do so, the test mode 2002 can be activated. For example, the control device 91 can send a respective command and optionally settings to the test module 121.

As a general rule there are various options available for determining the reliability of the impedance in block 1003 and some of the options are illustrated in connection with FIG. 6.

Figure 6:
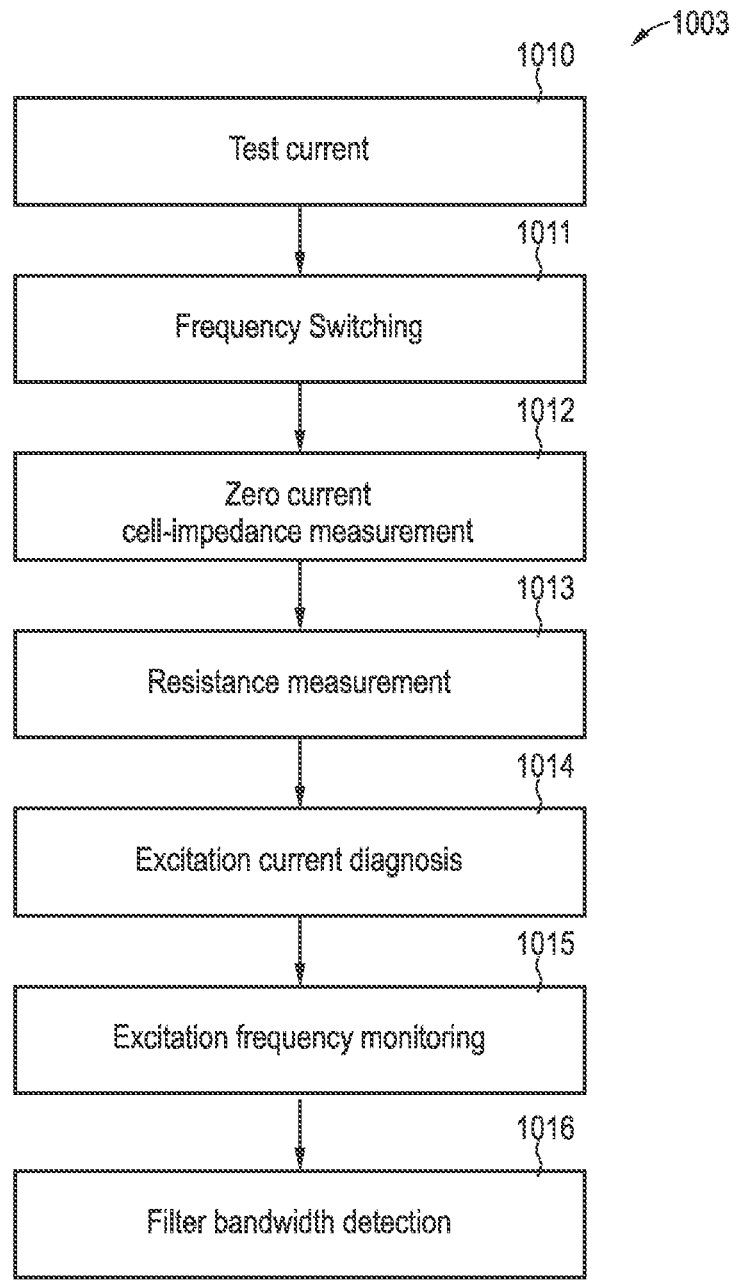
FIG. 6 is a flowchart of a method according to various examples.

FIG. 6 is a flowchart of a method according to various examples. The method according to FIG. 6 helps to determine the reliability of a cell impedance that is, e.g., measured using techniques as described above in connection with FIG. 5: block 1001.

The method according to FIG. 6 includes multiple blocks 1010-1016. These blocks 1010-1016 correspond to different options for implementing the determining of the reliability of the cell impedance. As a general rule, it is not required that all blocks 1010-1016 are implemented to determine the reliability; rather, it would be possible that only a single one of the blocks 1010-1016 is implemented to determine the reliability or that a certain combination of blocks 1010-1016 is implemented to determine the reliability. It would also be possible that the sequence of executing the blocks 1010-1016 is changed. One or more of the blocks 1010-1016 can be executed as part of block 1003 of FIG. 5.

At block 1010, an AC test current is provided to the battery cell device 111-113. The AC test current is different from the AC excitation current used during the measurement mode 2001. Therefore, using the AC test current, it becomes possible to test an integrity of the shunt resistor 252. It would also be possible to test integrity of the shunt interfaces 215, 216 and/or of the AC interfaces 212, 213. In some examples, it is possible to test the integrity of the MUX 301 of the communication module 120 and/or of the ADCs 311, 312 of the communication module 120. By comparing a response/behavior of one or more of the identified components of the BMS to the AC test current, it becomes possible to test their integrity. If a compromised integrity of one or more of the components is identified, this can be an indicator of a reduced reliability of the cell impedance.

At block 1011, the properties of the AC excitation current 71 are changed. In particular, it is possible to change the frequency of the AC excitation current 71, e.g., between a first value and a second value. It is possible to determine the cell impedance for both values of the frequency of the AC excitation current 71. It would be possible to determine the temperature for both values of the frequency of the AC excitation current 71. Then, based on a comparison between the two impedances or two temperatures with each other, irregularities can be identified. For example, if the two measures deviate significantly, the reliability of the cell impedance can be judged to be low. The option described in connection with block 1011 may correspond to an end-to-end test of the components involved in the impedance measurement.

At block 1012, a zero-current cell-impedance measurement can be implemented. Hence, a particularly low amplitude of the AC excitation current 71—e.g., zero amplitude—can be chosen. For example, electromagnetic interference (EMI) could couple into the components of the BMS and result in a significant voltage across the battery cell. For example, if EMI at the frequency of the AC excitation current 71 is present at the battery cell 200 (e.g., due to a current in the high voltage current path) this voltage is superposed with the voltage generated by the AC excitation current 71. This will lead to a measurement error.

To detect this failure, a measurement without AC excitation current 71 can be performed and the raw data of the respective ADC 311, 312 can be evaluated; this raw data then represents the interference. The output of the ADC 311, 312 can be compared with a predefined threshold to the limit for the allowed noise floor. Thus, the zero-current measurement can help to identify a noise floor of the measurement of the cell impedance.

At block 1013, the resistance of the cell interfaces 201, 218 and/or of the AC interfaces 212, 213 can be measured. For example, a resistance between the cell force terminal implemented by the cell interface 201 and the cell sense terminal implemented by the AC interface 212 can be measured. As explained above in connection with FIG. 3, the cell interfaces 201, 218 act as cell force terminals; while the AC interfaces 212, 213 act as cell sense terminals. By measuring the resistance, it is possible to detect electrical short circuit. Such an electrical short circuit may result in an inaccurate measurement of the voltage 51 across the battery cell 200; such that the reliability of the cell impedance would be compromised.

At block 1014, the AC excitation current can be diagnosed. For this, it would be possible to, e.g., check whether the amplitude of the AC excitation current is within a certain window of acceptance, i.e., remains above a predefined lower threshold and remains below a predefined upper threshold. Malfunctioning of a corresponding AC excitation current source can thereby be identified. Malfunctioning of the AC excitation current source can compromise the reliability of the cell impedance.

At block 1015, the frequency of the AC excitation current can be diagnosed. For example, the AC excitation current could be compared to a periodical reference signal being generated using an independent timing reference. Then, deviations of the frequency of the AC excitation current can be detected based on this comparison. Such deviations can be indicative of malfunctioning of the corresponding AC excitation current source. Malfunctioning of the AC excitation current source can compromise the reliability of the cell impedance.

At block 1016, a filter bandwidth of one or more filters of the battery cell device 111-113 can be checked. For example, the cut-off frequency of the filter 231 and/or of the filter 241 may be determined. Changes in the filter characteristics can be indicative of damage of the respective filter components 232, 233, 242, 243. This can compromise the reliability of the cell impedance.

Hereinafter, details with respect to at least some of the options according to blocks 1010-1016 are discussed.

Figure 7:
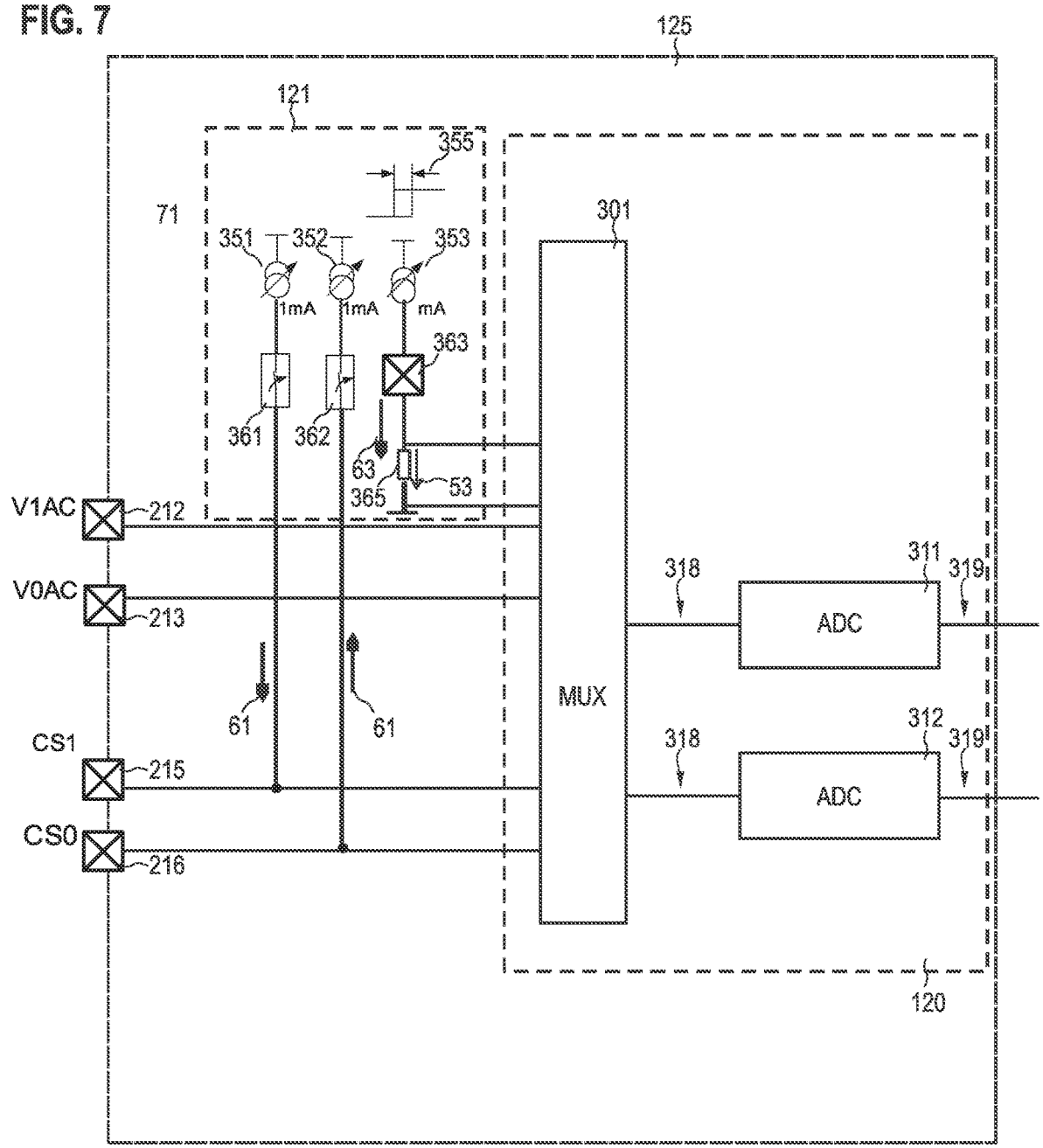
FIG. 7 schematically illustrates details of the test module according to various examples.

FIG. 7 illustrates aspects with respect to the test module 121. More specifically, FIG. 7 illustrates aspects in connection with the injection of AC test currents 61, 63, e.g., as explained above in connection with FIG. 6: block 1010.

As a general rule, while FIG. 7 illustrates aspects with respect to the test module 121 providing the AC test currents 61, 63, it would be possible that the test module 121 also includes one or more current sources and/or voltage sources to provide the AC excitation current 71 (not shown in FIG. 7). For example, the test module 121 may switch on/off the transistor switch 253 via the interface 214 to provide the AC excitation current 71.

In FIG. 7, it is illustrated that the test module 121 is configured to provide the AC test current 61. The AC test current 61 is injected into the shunt resistor 252 via the shunt interfaces 215, 216. A corresponding voltage 52 across the shunt resistor 252 associated with the AC test current 61 results.

While in the example of FIG. 7, the AC test current 61 is generated using two current sources 351, 352 that are, respectively, connected to one of the shunt interfaces 215, 216 (i.e., different sides of the shunt resistor 252), in other examples, the AC test current 61 may be generated using a single current source only that is connected to one of the shunt interfaces 215, 216. By using two current sources 351, 352, it is possible to compensate a wiring or connection resistance 261, 262 (cf. FIG. 3).

The ADC 311 and/or the ADC 312 (depending on the setting of the MUX 301) are configured to measure the shunt voltage 52 across the shunt resistor 252 associated with the AC test current 61.

As illustrated in FIG. 7, the AC current sources 351, 352 are connected to the shunt interfaces 215, 216 via the switches 361, 362. It would be possible that the switches 361, 362 are configured to selectively forward the AC test current 61 when the test mode 2002 is active. Also, the AC current sources 351, 352 can be selectively switched on in the test mode 2002 (and switched off in the measurement mode 2001). This is based on the finding that if the AC test current 61 was active during cell impedance measurement in the measurement mode 2001, the AC test current 61 might influence the cell impedance measurement. The AC test current 61 influences the current measurement by introducing an additional current in the range of 1 mA, which is compared to the e.g. 500 mA during the measurement mode 2001 quite small. Also, the voltage drop caused by the AC test current 61 over the shunt interfaces 215, 216 can typically be neglected since the additional voltage is in the range of 1 mA*10 mOhm=10 µV. Nevertheless, two current sources 351, 352 can be additionally protected by two independent mechanisms: firstly, the current sources 351, 352 are deactivated in the measurement mode 2001; secondly, switches 361, 362 are used to selectively forward the AC test current 61 in the test mode 2002.

It would be possible to compare the shunt voltage 52 associated with the AC test current 61 with a reference voltage, e.g., at the control device 91. Thereby, it can be possible to detect malfunction of the shunt resistor 252.

This provides for a comparably simply test functionality. In various options, a more complex test functionality can be provided, e.g., by using the further current source 353.

In the example of FIG. 7, the test module 121 also includes the further current source 353 that is configured to inject a further AC test current 63 into a resistor 365 via a corresponding interface 363. A voltage 53 across the resistor 365 associated with the further AC test current 63 is illustrated in FIG. 7. It would then be possible that the ADC 311 and/or the ADC 312 are arranged to measure the voltage 53 across the resistor 365 associated with the further AC test current 63.

As will be appreciated, provisioning of the multiplexer 301 helps to selectively connect the resistor 365 to one or more of the ADCs 311, 312. For example, it would be possible that the multiplexer 301 selectively forwards a signal associated with the voltage 53 across the resistor 365 when the test mode 2002 is active. To give a specific example, it would be possible that the multiplexer 301 is configured to provide, in the measurement mode 2001, the cell voltage 51 associated with the AC excitation current 71 (cf. FIG. 3) to one or more of the ADCs 311, 312; and to provide, in the test mode 2002, the voltage 53 across the resistor 365 associated with the further AC test current 63 to one or more of the ADCs 311, 312 (e.g., instead of providing the cell voltage 51).

For example, in one scenario, it would be possible that, in the test mode 2002, the multiplexer 301 alternatingly provides the voltage 53 associated with the further AC test current 63 to the ADC 311 and the ADC 312, respectively; and to alternatingly provide the shunt voltage 52 associated with the AC test current 61 to the respectively other one of the ADC 312 and the ADC 311, respectively.

Such an example is illustrated in the following Tables. 1 and 2:

TABLE 1

(Mapping of ADCs 311, 312 in Measurement mode 2001 using AC excitation current 71)

| Phase | ADC 311 | ADC 312 |
| --- | --- | --- |
| (i) | Cell voltage 51 | Shunt voltage 52 |

TABLE 2

(Mapping of ADCs 311, 312 in test mode 2002 using AC test currents 61, 63)

| Phase | ADC 311 | ADC 312 |
| --- | --- | --- |
| (i) | Shunt voltage 52 | Voltage 53 |
| (ii) | Voltage 53 | Shunt voltage 52 |

In other words, the connection between the ADCs 311, 312 and the resistor 365 and the shunt resistor 252 can be alternatingly swapped, as illustrated in Tab. 2. Thereby, malfunctioning of one of the ADCs 311, 312 and of the MUX 301 can be detected. For example, if there is a deviation between the measurement made by the ADC 311 for the voltage 53 from the measurement made by the ADC 312 for the voltage 53, this can be indicative of a respective malfunction.

As a general rule, phase (ii) of Table 2 is optional. It would be possible to only operate the MUX 301 in phase (i) in the test mode 2002.

As illustrated in FIG. 7, the AC current sources 351, 352 and the AC current source 353 are configured to output the AC test current 61 and the further AC test current 63 phase coherently. Hence, they can be a well-defined phase offset or phase shift 355 between the AC test current 61 and the further AC test current 63.

As a general rule, it would be possible that the AC current sources 351, 352, 353 are matched with each other; i.e., there can be a high relative accuracy between the AC current sources 351, 352, 353.

For example, using the AC test currents 61, 63 it is possible to determine one or more of the following faults: The shunt resistor 252 can be checked; for this, the nominal resistivity of the shunt resistor 252 should be known; and the connection from shunt resistor 252 to the MUX 301 via the shunt interfaces 215, 216 can be tested; the MUX 301 can be tested, e.g., based on a comparison of the measured values in the test mode 2002 and reference values; also the signal processing chain incl. ADCs 311, 312 can be tested.

Next, the function of the AC test currents 61, 63 to determine the reliability of the cell impedance will be described.

The AC test currents 61, 63 can be used to emulate the cell impedance. For this, the voltage 52 across the shunt resistor 252 associated with the AC test current 61 is measured using the ADCs 311, 312, as well as the voltage 53 across the resistor 365 associated with the further AC test current 63. In detail, the voltage 52 associated with the AC test current 61 can emulate the voltage 52 associated with the AC excitation current 71; and the voltage 53 associated with the further AC test current 63 can emulate the cell voltage 51 associated with the AC excitation current 71.

To obtain/generate the phase information of the complex cell impedance, the AC test currents 61, 63 are delayed to each other. The delay will result in the phase shift 355. Due to the matching of the current sources 351-353, uncertainties of the current generation of the AC test currents 61, 63 can be canceled. In order to cancel out the uncertainties the resistance of the resistor 365, the AC test current 63 may be generated by a resistor matching with the resistor 365.

The emulated impedance can be calculated as:

$$Z_{TestPattern} = \frac{I_{DIAG1}(R_S + R_{CON1}) - I_{DIAG2}R_{CON2}}{\frac{R_{DIAG}I_{DIAG3}}{R_{S\_NOM}}} e^{2\pi f_{EXC} t_{delay}} \quad (1)$$

Here, $R_{CON1}$ and $R_{CON2}$ are the resistances of the connection resistances 261, 262 of the shunt interfaces 215, 216 (cf. FIG. 3), $R_S$ is the resistance of the shunt resistor 252, and $R_{S\_NOM}$ is the target resistance of the shunt resistor 252 used in the post processing (the parasitic connection resistances 261, 262 may lead to a measurement inaccuracy; by using $R_{S\_NOM}$, a compensation can be achieved). Since the current $I_{DIAG1}$ and $I_{DIAG2}$—i.e., the respectively generated parts of the AC test current 61 associated with each current source 351, 352—are matching, the common resistances $R_{CON1}$ and $R_{CON2}$ of the connection resistances 261, 262 are canceled out. What remains is the mismatch of the current sources 351, 352 and the mismatch of the connection resistance 261, 262. fEXC is the frequency of the AC excitation current and $t_{delay}$ is a phase offset.

For example, the emulated impedance could be calculated according to Eq. (1) and compared to the measured value during the test mode 2002. A corresponding method relying on Eq. 1 is illustrated in FIG. 8.

Figure 8:
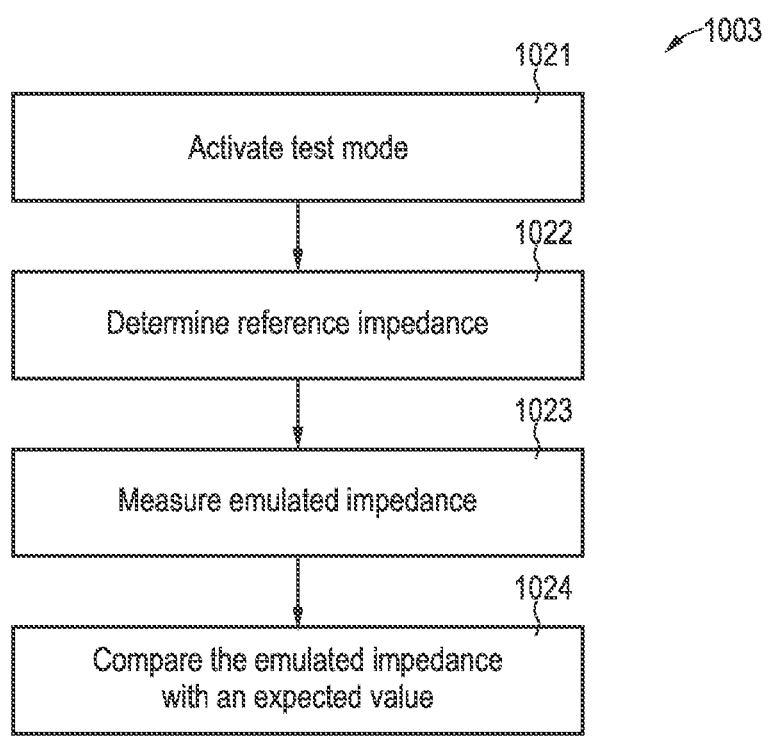
FIG. 8 is a flowchart of a method according to various examples.

FIG. 8 is a flowchart of a method according to various examples. For example, the method of FIG. 8 may be executed by a control logic, e.g., the control device 91. For example, the method of FIG. 8 may be executed as part of block 1003 (cf. FIG. 5). The method of FIG. 8 helps to determine the reliability of a cell impedance that has been previously measured (e.g., as part of block 1001, cf. FIG. 5).

At block 1021, the test mode 2002 is activated. This may include sending a control signal to the test module 121 to close the switches 361, 362 and to switch on the current sources 351-353. Thereby, the AC test current 61 is injected into the shunt resistor 252 and the further AC test current 63 is injected into the resistor 365.

Then, blocks 1022-1024 are used to determine the reliability of the cell impedance that has been previously measured. The reliability is determined based on a measurement of the voltage 52 across the shunt resistor 252 associated with the AC test current 61 injected into the shunt resistor 252 at block 1021; and based on a measurement of the voltage 53 across the resistor 365 associated with the further AC test current 63. From these two values, an emulated cell impedance is obtained. Then, determining the reliability of the cell impedance can include comparing and emulated cell impedance with a reference impedance. Such a scenario is explained below in connection with blocks 1022-1024.

In detail, at block 1022, the reference impedance is determined, e.g., by calculating or otherwise determining the reference impedance according to Eq. (1). For example, a lookup table may be employed.

Next, at block 1023, the emulated cell impedance can be measured. For example, this may involve dividing the measured voltage 53 across the resistor 365 associated with the AC test current by the measured voltage 52 across the shunt resistor 252 associate with the AC test current 61, e.g., taking into account the resistance of the shunt resistor 252.

Next, at block 1024, the emulated impedance of block 1024 is compared with an expected value. Generally, the expected value can be determined based on the reference impedance determined in block 1022. If a significant deviation—e.g., beyond certain error margins and/or within accuracy requirements—is detected, then this can be indicative of malfunctioning of one or more of the components, e.g., of the shunt resistor 252, a connection between the shunt resistor 252 and the communication module 120, the multiplexer 301, or one or both of the ADCs 311, 312, etc.

As a general rule the measured voltage across the, the AC test currents 61, 63 can be (i) static, i.e., fixed amplitude, phase and frequency; or (ii) depend on the measured cell impedance of the battery cell 200. For the dynamic AC test currents 61, 63 it would thus be possible that the control device 91 controls the AC current sources 351-353 based on the cell impedance of the battery cell 200 as part of block 1023. Likewise, the reference impedance may be determined by appropriately adjusting the values for the AC test currents 61, 63 in Eq. (1) in block 1022.

Such techniques are based on the finding that—in order to gain a high diagnostic coverage fault model of the ADCs 311, 312—linearity failures have to be covered. This is illustrated in connection with FIG. 9.

Figure 9:
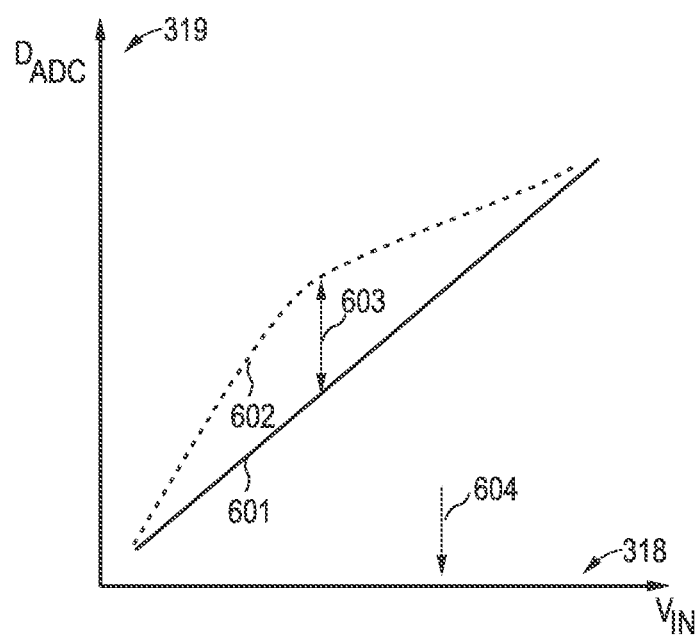
FIG. 9 schematically illustrates the operation of an analog-to-digital converter according to various examples.

FIG. 9 schematically illustrates aspects with respect to the operation of the ADCs 311, 312. Specifically, FIG. 9 illustrates aspects with respect to a linearity error 603. FIG. 9 schematically illustrates the measurement value 319 output by the ADC 311 or the ADC 312 depending on the respective input 318. The respective characteristic 601 was typically designed to have a linear dependency. Where there is a linearity error 603, the respective characteristic 602 deviates from the linear form.

To facilitate detection of a linearity failure of the used ADC, the AC test currents 61, 63 may be set so that the same operating point 604 as the previous cell impedance measurement in the measurement mode 2001 is used at the respective ADC 311, 312. Thus, the amplitude of the AC test current 61 and/or of the further AC test current 63 can be adjusted in accordance with the previous cell impedance measurement result. Also, the frequency of the AC test currents 61, 63 and the phase shift 355 can be determined in accordance with the previous cell impedance measurement result.

As a general rule, various combinations of static or dynamically configurable amplitude/phase/frequency for the test currents 61, 63 are possible, leading to different diagnostic coverage.

A typical amplitude of the AC excitation current 71 is in the order of 1 A; typically, it is not easy to generate the AC test current 61 having a similarly large amplitude. Hence, it would be possible to use a smaller AC test current 63 and dimension the resistance of the resistor 365 such that the voltage 53 corresponds to the voltage 52 across the shunt resistor 252 during measurement mode 2001. Hence, the resistance of the resistor 365 can be larger than the resistance of the shunt resistor 252.

It would then be possible to route the signal associated with the voltage 53 across the resistor 365 associated with the further AC test current 63 to the ADC 311 which is used, during measurement mode 2001, to measure the voltage 52 across the shunt resistor 252 (cf. Table 1, ADC 312: phase (i) and Table 2, phase (i)).

Likewise, it would be possible to route the signal associated with the voltage 52 across the shunt resistor 252 associated with the AC test current 61 to the ADC 311 which is used, during measurement mode 2001, to measure the cell voltage 51 across the battery cell 200 (cf. Table 1, ADC 311: phase (i) and Table 2, phase (i)). Again, it would be possible to dimension the amplitude of the AC test current 61 such that the voltage 52 across the shunt resistor 252 associated with the AC test current 61 in the test mode 2002 corresponds to the cell voltage 51 across the battery cell 200 associated with the AC excitation current 71 in the measurement mode 2001.

It would also be possible to dynamically adjust a shape of the waveform of the AC test current 61, 63, e.g., sinusoidal or rectangular.

It would also be possible that in amplitude of the AC test currents 61, 63 is adjusted depending on the number of battery cells 200 connected in parallel per battery module.

Figure 10:
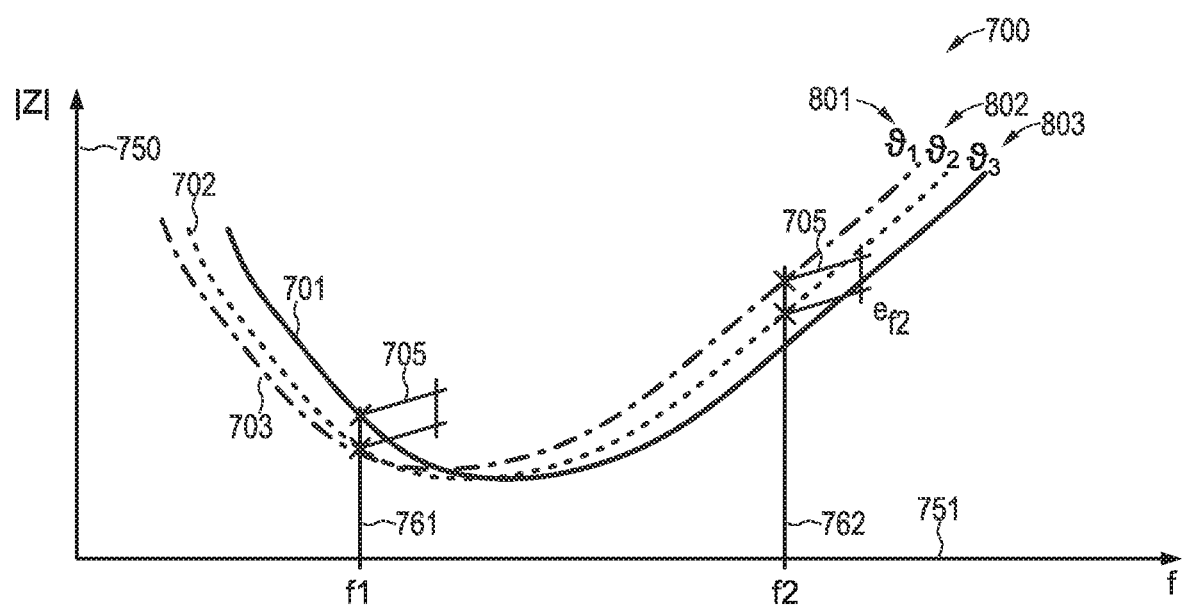
FIG. 10 schematically illustrates a dependency between a cell impedance of a battery cell of the battery cell device, a frequency of the AC excitation current, and a temperature of the battery cell of the battery cell device, according to various examples.

FIG. 10 schematically illustrates aspects with respect to determining a reliability of the cell impedance of the battery cell 200. FIG. 10 specifically illustrates aspects with respect to the test mode 2002 in which a frequency switching technique according to block 1011 (cf. FIG. 6) is employed.

FIG. 10 schematically illustrates the cell impedance 750 as a function of the frequency 751 of the AC excitation current 71, for three different temperatures 801-803. Respective temperature-impedance characteristics 701-703 are illustrated in FIG. 10 (using the full line, the dotted line, and the dashed-dotted line for the different temperatures 801-803).

According to an example, the reliability of the cell impedance 750 is determined by determining the cell impedance 750 at more than a single frequency, i.e., in the example of FIG. 10 at the frequencies 761 and 762. The cell impedance 750 determined at the two frequencies 761, 762 would differ in case of measurements faults like stuck-at faults of registers, wrong frequency settings, and offsets in the start of measurement. More specifically, the determined cell impedance will show an expected frequency dependency and temperature dependency according to the temperature-impedance characteristics 701-703. A fault in the measurement/processing path will lead to a common error 705 in both measurements (towards higher cell impedances 750 in the example of FIG. 10). As shown in FIG. 10, the error 705 at frequency 761 will be interpreted by the control device 91 as temperature 803. The same error 705 at the measurement frequency 762 will be interpreted as temperature 801. The control device 91 compares the two temperatures 801, 803, e.g., by applying a two out of two (2oo2) decision. Thus, a deviation can be recognized as fault. Details with respect to the logic for determining the reliability are also illustrated in connection with FIG. 11.

Figure 11:
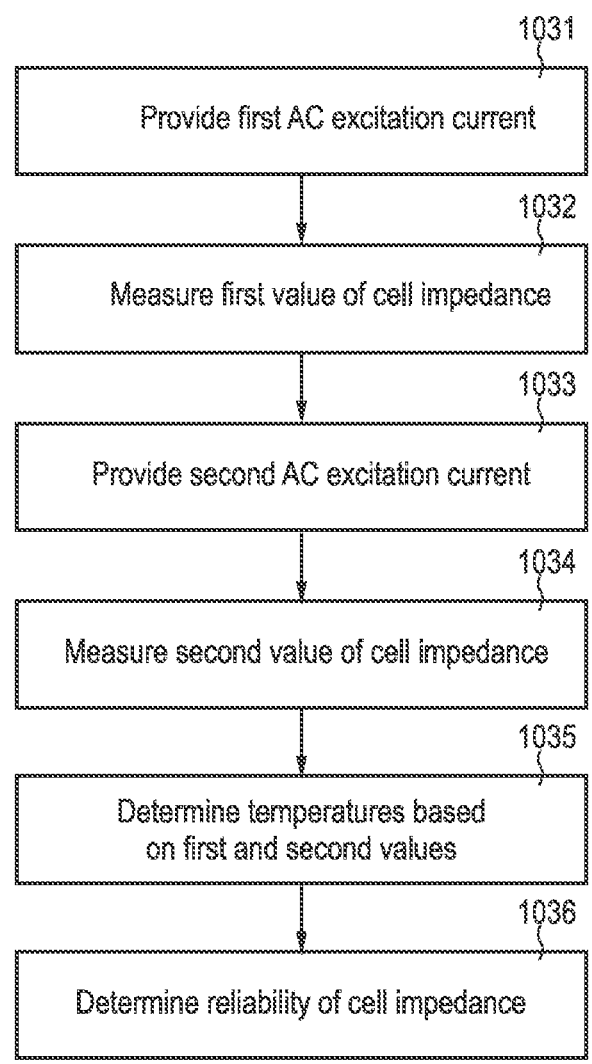
FIG. 11 is a flowchart of a method according to various examples.

FIG. 11 is a flowchart of a method according to various examples. For example, the method of FIG. 11 could be executed by the control device 91. FIG. 11 schematically illustrates aspects with respect to determining the reliability of a cell impedance, e.g., measured according to the techniques as described above in connection with FIG. 5: block 1001. FIG. 11 illustrates aspects with respect to determining the reliability by using frequency switching as explained above in connection with FIG. 6: block 1011.

At block 1031, a first AC excitation current 71 is provided to the battery cell device 111-113. The first AC excitation current 71 has a first frequency.

Next, at block 1032, a first value of the cell impedance 750 is measured. This measurement is based on the first AC excitation current. For example, a voltage 51 across the battery cell 200 can be set into relation with the first AC excitation current 71, e.g., measured as voltage 52 across the shunt resistor 252.

Next, at block 1033, a second AC excitation current 71 is provided to the battery cell device 111-113. The second AC excitation current 71 has a second frequency.

Next, at block 1034, a second value of the cell impedance 750 is measured. This measurement is based on the second AC excitation current. For example, a voltage across the battery cell associated with the second AC excitation current can be set into relation with the second AC excitation current 71, e.g., measured using a shunt resistor 252.

Next, at block 1035, the temperatures 801-803 associated with the cell impedances 750 measured at blocks 1032 and 1034 are determined based on the predefined temperature-impedance characteristics 701-703.

Then, block 1036, the reliability of the cell impedance is determined, e.g., by comparing the temperatures determined at block 1035.

Figure 12:
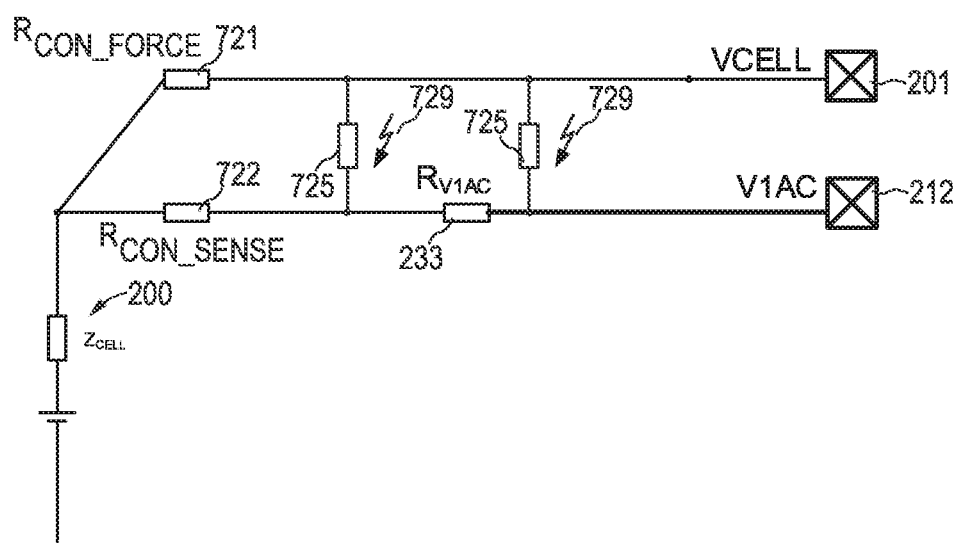
FIG. 12 schematically illustrates an electrical short circuit between a cell force terminal and a cell sense terminal according to various examples.

FIG. 12 schematically illustrates aspects with respect to determining a reliability of the cell impedance of the battery cell 200. FIG. 12 specifically illustrates aspects with respect to the test mode 2002 in which a resistance measurement according to block 1013 (cf. FIG. 6) is employed. In FIG. 12, two possible short circuits 729 between the cell force terminal implemented by the cell interface 201 and the cell sense terminal implemented by the AC interface 212 are illustrated.

In the example of FIG. 12, a resistance can be determined between the cell interface 201 (acting as cell force terminal for the AC excitation current 71, as explained above), and the AC interface 212 (acting as cell sense terminal for the AC excitation current 71. Then, a threshold comparison can be performed with a predefined threshold resistance. The reliability of the cell impedance can be determined based on the threshold comparison. E.g., a small resistance can be indicative of a short between the interfaces 201, 212.

These techniques are based on the finding that the short circuits 729 between the cell interface 201 and the AC interface 212 can lead to an unintended voltage drop also along the AC interface 212. With the fault present, the measured cell impedance 750 increases by the contact resistance 721, 722, i.e., at the connection between the interfaces 201, 212 and the battery cell 200, respectively:

$$Z_{MEAS} = Z_{CELL} + \frac{R_{CON\_SENSE} \cdot (R_{FORCE} + R_{CON\_FORCE})}{R_{CON\_SENSE} + R_{FORCE} + R_{CON\_FORCE}}$$

To be able to detect the short circuits 729, it is possible to dimension the contact resistances 721, 722 to be sufficiently large, e.g., larger than the cell resistance by a factor of 2 or 3 or more. Also, to increase the resistances 725 of the short circuits 729, a minimum distance between the current lines associated with the interfaces 201, 212 can be maintained (segregation rule). Thereby, if any increase in the resistance is measured, this can be indicative of the short circuit 729.

Figure 13:
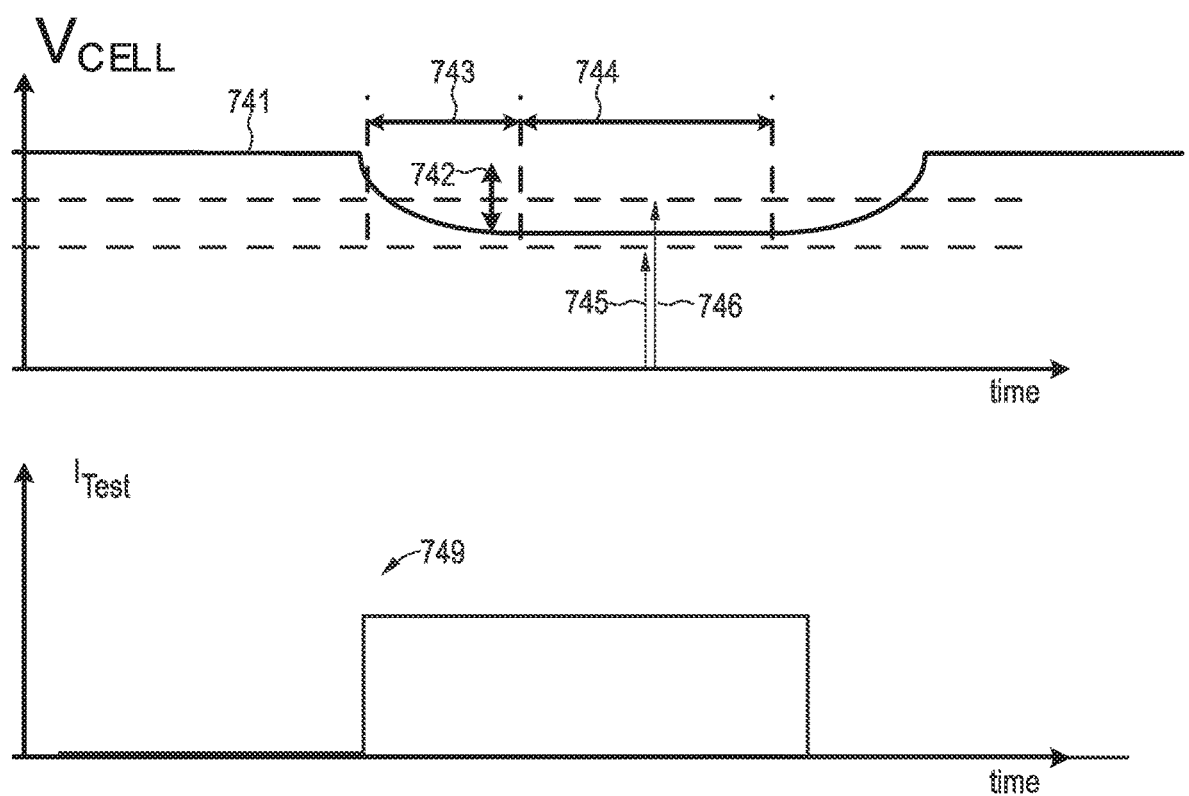
FIG. 13 schematically illustrates a voltage response of the battery cell device to a current pulse according to various examples.

FIG. 13 schematically illustrates aspects with respect to determining a reliability of the cell impedance of the battery cell 200. FIG. 13 specifically illustrates aspects with respect to the test mode 2002 in which a filter bandwidth detection according to block 1016 (cf. FIG. 6) is employed.

In FIG. 13, an AC test current pulse 749 is applied to the battery cell device 111-113. Specifically, the AC test current pulse 749 can be provided via the AC interfaces 212, 213. While in FIG. 13 a step-shaped AC test current pulse 749 is illustrated, other shapes would be possible.

Then, the voltage response 741 of the battery cell device 111-113 is measured, e.g., using the cell interfaces 201, 218. A voltage drop 742 is observed, having a time constant 743. Based on the voltage response 741, it is possible to determine the reliability of the cell impedance. For example, it would be possible to characterize the filter 231, e.g., the filter bandwidth.

This mechanism can be implemented together with the open load diagnosis during the time interval 744, checking the resistance of the resistor 233 of the AC interface 212. A threshold comparison with the reference thresholds 745, 746 can be performed.

Figure 14:
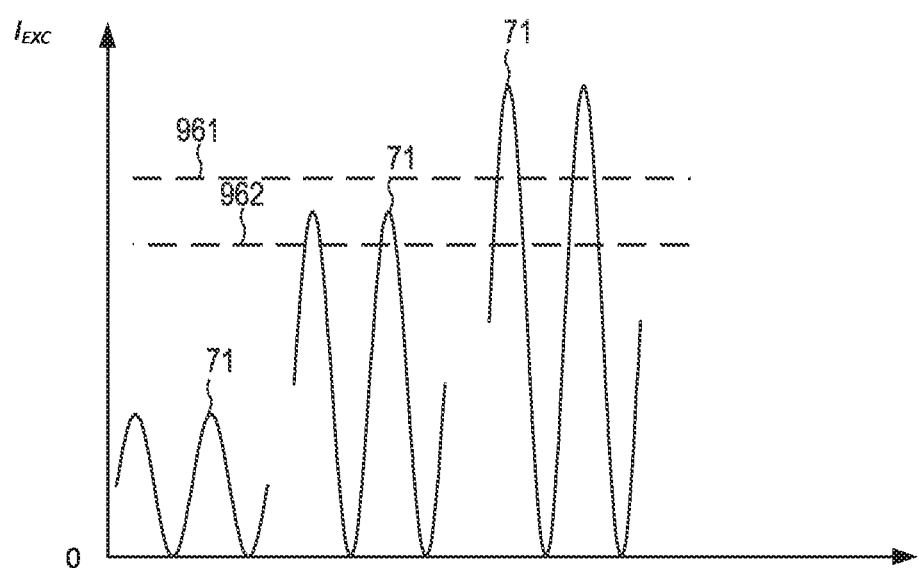
FIG. 14 schematically illustrates a threshold comparison between an amplitude of an AC excitation current and predefined thresholds according to various examples.

FIG. 14 schematically illustrates aspects with respect to determining a reliability of the cell impedance of the battery cell 200. FIG. 14 specifically illustrates aspects with respect to the test mode 2002 in which the AC excitation current 71 is diagnosed according to block 1014 (cf FIG. 6).

In FIG. 14, the amplitude of the AC excitation current 71 is compared with upper and lower predefined thresholds 961, 962. Based on the comparison, a reliability of the cell impedance is determined. For example, the threshold comparison can be executed by the control device 91.

In detail, two checks are possible: (i) Firstly, measurement results of the output of the ADC 312; and (ii) secondly a plausibility check of a current regulation loop Where the output of the ADC 312 is checked, the respective output is compared to the expected value using the thresholds 961, 962. The expected value is given by the amplitude of the AC excitation current 71, the resistance of the shunt resistor 252 and the gain of the ADC 312. All parameters are known, thus the expected value can be determined in advance. The impedance measurement is not very sensitive to the amplitude of the excitation current 71. Thus, the accuracy requirement for the excitation current check is not very critical.

The amplitude of the AC excitation current 71 can be determined and then checked by comparing the measured voltage 52 across the shunt resistor 252 with the expected current based on the following equation:

$$I_{Excitation} = V_{PCVM}/(R_L + R_{shunt}) = VIADC/R_{shunt}$$

A regulated current source of the AC excitation current 71 can be checked for the various sections of the regulation loop (i.e., controller, actuator, transmission path, measurement).

Figure 15:
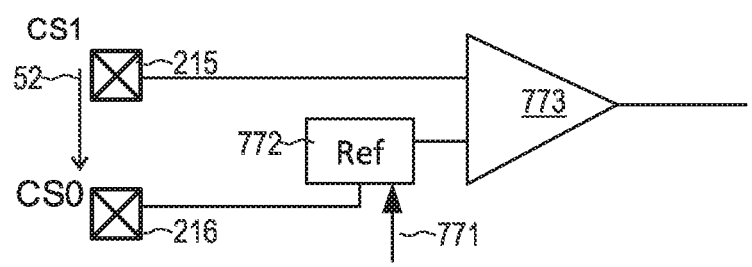
FIG. 15 schematically illustrates a comparison between a frequency of the AC excitation current and a timing reference according to various examples.

FIG. 15 schematically illustrates aspects with respect to determining a reliability of the cell impedance of the battery cell 200. FIG. 15 specifically illustrates aspects with respect to the test mode 2002 in which the frequency of the AC excitation current 71 is diagnosed according to block 1015 (cf. FIG. 6).

In FIG. 15, a comparison between a timing of a first timing reference used to provide the AC excitation current 71 and a further timing 771 associated with a second timing reference 772 different from the first timing reference is implemented. A corresponding element 773 is illustrated, implementing the comparison. Then, the reliability of the cell impedance is determined based on the comparison. The comparison is based on the voltage 52 across the shunt resistor 252.

Summarizing, a bundle of options for a safety mechanism intended to make the impedance measurement of a battery cell safe have been described above. According to some examples, an AC test current is generated using adjustable current sources, thereby emulating the cell impedance in the same range as the measured cell impedance. Using adjustable current sources, it is possible to emulate all typical battery cell impedances by varying an amplitude of respective test currents. These AC test currents use some parts of the measurement chain to check them. The generation of the AC test currents requires only the minimum amount of extra hardware. Parasitic currents can be compensated for in the AC test current generation.

Furthermore, further options for safety mechanisms are described to gain an even higher diagnostic coverage, e.g., beyond the use of the AC test currents only. For example, the reliability of the cell impedance can be determined by evaluating the impedance at more than one frequency of the AC excitation current. A fault in the measurement/processing path will lead to a common error in the measurements at the multiple frequencies.

In particular, the following examples have been described above:

EXAMPLE 1

A device (125), comprising: a first interface (201, 214, 218) configured to inject an AC excitation current (71) into a battery cell (200) and a shunt resistor (252) coupled in parallel to the battery cell (200), a second interface (215, 216) configured to inject an AC test current (61) into the shunt resistor (252), and analog-to-digital converters (311, 312) configured to measure a cell voltage (51) across the battery cell (200) associated with the AC excitation current (71), a shunt voltage (52) across the shunt resistor (252) associated with the AC excitation current (71) and the shunt voltage (52) across the shunt resistor (252) associated with the AC test current (61).

EXAMPLE 2

The device (125) of example 1, further comprising: a further resistor (365), and a third interface (363) configured to inject a further AC test current (63) into the further resistor (365), wherein the analog-to-digital converters (311, 312) are further configured to measure a further voltage (53) across the further resistor (365) associated with the further AC test current (63).

EXAMPLE 3

The device (125) of example 2, further comprising: a multiplexer (301) coupled to the analog-to-digital converters (311, 312), wherein the multiplexer (301) is configured to provide, in a first operational mode (2001), the cell voltage (51) to the analog-to-digital converters (311, 312) and, in a second operational mode (2002), the further voltage (53) to the analog-to-digital converters (311, 312).

EXAMPLE 4

The device (125) of example 3, wherein the analog-to-digital converters (311, 312) comprise a first analog-to-digital converter (311) and a second analog-to-digital converter (312), and wherein the multiplexer (301) is further configured, in the second operational mode (2002), to alternatingly provide the further voltage (53) to the first analog-to-digital converter (311) and the second analog-to-digital converter (312), and to alternatingly provide the shunt voltage (52) to the second analog-to-digital converter (312) and the first analog-to-digital converter (311), respectively.

EXAMPLE 5

The device (125) of any one of examples 2 to 4, wherein at least one first AC current source (351, 352) is configured to output the AC test current (61), wherein a second AC current source (353) is configured to output the further AC test current (63), and wherein the at least one first AC current source (351, 352) and the second AC current source (353) are configured to phase-coherently provide the AC test current (61) and the further AC test current (63).

EXAMPLE 6

The device (125) of example 5, wherein the at least one first AC current source (351, 352) comprises a pair of first AC current sources (351, 352) coupled with different sides of the shunt resistor (252), respectively.

EXAMPLE 7

A system (90), comprising: the device (125) of example 5 or 6 and a control logic (91) configured to control the at least one first AC current source and the second AC current source based on a cell impedance (750) of the battery cell (200).

EXAMPLE 8

The system (90) of example 7, wherein the control logic (91) is further configured to set at least one of an amplitude of the AC test current (61), an amplitude of the further AC test current (63), and a phase offset (355) between the AC test current (61) and the further AC test current (63) in accordance with the cell impedance (750) of the battery cell (200).

EXAMPLE 9

The system (90) of example 7 or 8, wherein the control logic (91) is further configured to determine an emulated cell impedance (750) based on the further voltage (53) associated with the further AC test current (63) and based on the shunt voltage (52) associated with the AC test current (61), and wherein the control logic (91) is further configured to determine a reliability of the cell impedance (750) based on a comparison of the emulated cell impedance with a predefined reference impedance.

EXAMPLE 10

The system (90) of any one of examples 7 to 9, wherein the control logic (91) is further configured to determine at least one of a state of charge, a state of health, and a temperature (801-803) based on the cell impedance (750).

EXAMPLE 11

A method, comprising: in a first operational mode (2001): injecting an AC excitation current (71) into a battery cell (200) and a shunt resistor (252) coupled in parallel to the battery cell (200), and determining a cell impedance (750) of the battery cell (200) based on a cell voltage across the battery cell (200) associated with the AC excitation current (71) and based on a shunt voltage across the shunt resistor (252) associated with the AC excitation current (71), and the method further comprising, in a second operational mode (2002): injecting an AC test current (61) into the shunt resistor (252), and determining a reliability of the cell impedance (750) based on the shunt voltage across the shunt resistor (252) associated with the AC test current (61).

EXAMPLE 12

The method of example 11, further comprising: in the second operational mode: injecting a further AC test current (63) into a further resistor, the AC test current (61) and the further AC test current (63) being phase coherent, and determining an emulated cell impedance based on the shunt voltage associated with the AC test current (61) and a further voltage across the further resistor associated with the further AC test current (63), wherein the reliability of the cell impedance (750) is further determined based on a comparison between the emulated cell impedance (750) and a predefined reference impedance.

EXAMPLE 13

A method, comprising: providing a first AC excitation current (71) to a battery cell device (111-113), measuring a first value of a cell impedance (750) of a battery cell (200) of the battery cell device (111-113) based on the first AC excitation current (71), providing a second AC excitation current (71) to the battery cell (200), the first AC excitation current and the second AC excitation current having different frequencies (761, 762), measuring a second value of the cell impedance (750) of the battery cell (200) based on the second AC excitation current (71), based on a predefined temperature-impedance characteristic (701-703), determining a first temperature (801-803) based on the first value of the cell impedance (750) and determining a second temperature (801-803) based on the second value of the cell impedance (750), and determining a reliability of the cell impedance (750) based on a comparison of the first temperature (801-803) and the second temperature (801-803).

EXAMPLE 14

A method, comprising: injecting an AC excitation current (71) into a battery cell (200) using a force terminal (201), measuring a cell voltage (51) across the battery cell (200) using a sense terminal (212), determining a cell impedance (750) of the battery cell (200) based on the cell voltage (51) and the AC excitation current (71), measuring a resistance between the force terminal (201) and the sense terminal (212), performing a threshold comparison between a predefined threshold resistance and the measured resistance between the force terminal (201) and the sense terminal (212), and determining a reliability of the cell impedance (750) based on the threshold comparison.

EXAMPLE 15

A method, comprising: providing an AC excitation current (71) to a battery cell device (111-113), measuring a cell voltage (51) across a battery cell (200) of the battery cell device (111-113), determining a cell impedance (750) of the battery cell (200) based on the cell voltage (51) and the AC excitation current (71), providing a test current pulse (749) to the battery cell device (111-113), measuring a voltage response (741, 742) of the battery cell device (111-113) to the test current pulse, and determining a reliability of the cell impedance (750) based on the voltage response (741, 742).

EXAMPLE 16

A method, comprising: providing an AC excitation current (71) to a battery cell device (111-113), measuring a cell voltage (51) across a battery cell (200) of the battery cell device (111-113), determining a cell impedance (750) of the battery cell (200) based on the cell voltage (51) and the AC excitation current (71), performing a threshold comparison between an amplitude of the AC excitation current (71) and a reference amplitude (961, 962), and determining a reliability of the cell impedance (750) based on the comparison.

EXAMPLE 17

A method, comprising: providing an AC excitation current (71) to a battery cell device (111-113), the AC excitation current (71) being generated using a first timing reference, measuring a cell voltage (51) across a battery cell (200) of the battery cell device (111-113), determining a cell impedance (750) of the battery cell (200) based on the cell voltage and the AC excitation current (71), performing a comparison between a timing of the AC excitation current (71) and a further timing associated with a second timing reference different from the first timing reference, and determining a reliability of the cell impedance (750) based on the comparison.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For illustration, while above various techniques of determining the reliability of a cell impedance measured at a battery cell have been described, these techniques may be combined with further techniques of determining the reliability in further examples. To give a few examples, it would be possible to determine the reliability by monitoring the data communication between the communication module of the respective battery module and a control device. The data communication can have various fault causes such as data falsification or outdated or not updated ("stuck at") data. To, e.g., detect the "stuck at" data it would be possible to use one or more of the following techniques: (i) update counter; (ii) AC test current with slightly different emulated impedances; (iii) Measurement at two different frequencies; (iv) Zero-current measurement; (v) Internal register check (before each measurement the register is cleared by writing zeros and alternating ones and checked afterwards). The settings programmed/configured by the control device 91 can be in the first stage values which trigger the safety mechanism to check for latent faults. And afterwards the correct parameters can be communicated to the battery module 100 by the control device 91. To give yet a further example, it can be checked whether the cell impedance exhibits sudden changes during the measurement mode. The measured cell impedance is typically primarily temperature dependent. If the cell impedance changes faster than the expected temperature changing rate, then it can be concluded something has to be wrong.

What is claimed is:
1. A device, comprising:
a first interface configured to inject an AC excitation current into a battery cell and a shunt resistor coupled in parallel to the battery cell;
a second interface configured to inject an AC test current into the shunt resistor; and
analog-to-digital converters configured to measure a cell voltage across the battery cell associated with the AC excitation current, a shunt voltage across the shunt resistor associated with the AC excitation current, and the shunt voltage across the shunt resistor associated with the AC test current.

2. The device of claim 1, further comprising:
a further resistor; and
a third interface configured to inject a further AC test current into the further resistor,
wherein the analog-to-digital converters are further configured to measure a further voltage across the further resistor associated with the further AC test current.

3. The device of claim 2, further comprising:
a multiplexer coupled to the analog-to-digital converters and configured to provide, in a first operational mode, the cell voltage to the analog-to-digital converters and, in a second operational mode, the further voltage to the analog-to-digital converters.

4. The device of claim 3, wherein the analog-to-digital converters comprise a first analog-to-digital converter and a second analog-to-digital converter, and wherein the multiplexer is further configured, in the second operational mode, to alternatingly provide the further voltage to the first analog-to-digital converter and the second analog-to-digital converter, and to alternatingly provide the shunt voltage to the second analog-to-digital converter and the first analog-to-digital converter, respectively.

5. The device of claim 2, wherein at least one first AC current source is configured to output the AC test current, wherein a second AC current source is configured to output the further AC test current, and wherein the at least one first AC current source and the second AC current source are configured to phase-coherently provide the AC test current and the further AC test current.

6. The device of claim 5, wherein the at least one first AC current source comprises a pair of first AC current sources coupled with different sides of the shunt resistor, respectively.

7. A system, comprising:
the device of claim 5; and
a control logic configured to control the at least one first AC current source and the second AC current source based on a cell impedance of the battery cell.

8. The system of claim 7, wherein the control logic is further configured to set at least one of an amplitude of the AC test current, an amplitude of the further AC test current, and a phase offset between the AC test current and the further AC test current in accordance with the cell impedance of the battery cell.

9. The system of claim 7, wherein the control logic is further configured to determine an emulated cell impedance based on the further voltage associated with the further AC test current and based on the shunt voltage associated with the AC test current, and wherein the control logic is further configured to determine a reliability of the cell impedance based on a comparison of the emulated cell impedance with a predefined reference impedance.

10. The system of claim 7, wherein the control logic is further configured to determine at least one of a state of charge, a state of health, and a temperature based on the cell impedance.

11. A method, comprising:
in a first operational mode:
injecting an AC excitation current into a battery cell and a shunt resistor coupled in parallel to the battery cell; and
determining a cell impedance of the battery cell based on a cell voltage across the battery cell associated with the AC excitation current and based on a shunt voltage across the shunt resistor associated with the AC excitation current; and
in a second operational mode:
injecting an AC test current into the shunt resistor; and
determining a reliability of the cell impedance based on the shunt voltage across the shunt resistor associated with the AC test current.

12. The method of claim 11, further comprising:
in the second operational mode:
injecting a further AC test current into a further resistor, the AC test current and the further AC test current being phase coherent; and
determining an emulated cell impedance based on the shunt voltage associated with the AC test current and a further voltage across the further resistor associated with the further AC test current,
wherein the reliability of the cell impedance is further determined based on a comparison between the emulated cell impedance and a predefined reference impedance.

13. A method, comprising:
providing a first AC excitation current to a battery cell device;
measuring a first value of a cell impedance of a battery cell of the battery cell device based on the first AC excitation current;
providing a second AC excitation current to the battery cell, the first AC excitation current and the second AC excitation current having different frequencies;
measuring a second value of the cell impedance of the battery cell based on the second AC excitation current;
based on a predefined temperature-impedance characteristic, determining a first temperature based on the first value of the cell impedance and determining a second temperature based on the second value of the cell impedance; and
determining a reliability of the cell impedance based on a comparison of the first temperature and the second temperature.

* * * * *